(12) United States Patent
Engl et al.

(10) Patent No.: US 9,343,637 B2
(45) Date of Patent: May 17, 2016

(54) OPTOELECTRONIC SEMICONDUCTOR CHIP AND METHOD FOR PRODUCING OPTOELECTRONIC SEMICONDUCTOR CHIPS

(75) Inventors: Karl Engl, Pentling (DE); Markus Maute, Alteglofsheim (DE); Stefanie Rammelsberger, Zeitlarn (DE); Anna Kasprzak-Zablocka, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 170 days.

(21) Appl. No.: 13/981,879

(22) PCT Filed: Feb. 7, 2012

(86) PCT No.: PCT/EP2012/052053
§ 371 (c)(1),
(2), (4) Date: Oct. 7, 2013

(87) PCT Pub. No.: WO2012/110364
PCT Pub. Date: Aug. 23, 2012

(65) Prior Publication Data
US 2014/0021507 A1    Jan. 23, 2014

(30) Foreign Application Priority Data
Feb. 14, 2011    (DE) .......................... 10 2011 011 140

(51) Int. Cl.
*H01L 33/62* (2010.01)
*H01L 33/52* (2010.01)
*H01L 33/40* (2010.01)

(52) U.S. Cl.
CPC .............. *H01L 33/52* (2013.01); *H01L 33/405* (2013.01)

(58) Field of Classification Search
None
See application file for complete search history.

(56) References Cited

U.S. PATENT DOCUMENTS

| 8,283,191 | B2 | 10/2012 | Rode et al. |
| 8,319,250 | B2 | 11/2012 | Rode et al. |
| 8,653,540 | B2 | 2/2014 | Engl et al. |
| 2007/0023777 | A1 | 2/2007 | Sonobe et al. |

(Continued)

FOREIGN PATENT DOCUMENTS

| CN | 101681958 A | 3/2010 |
| DE | 102007038336 A1 | 2/2008 |

(Continued)

OTHER PUBLICATIONS

First Office Action with search report received for CN 201280008879.3, dated Sep. 2, 2015, 5 pages.

*Primary Examiner* — Ali Naraghi
(74) *Attorney, Agent, or Firm* — Slater Matsil, LLP

(57) ABSTRACT

An optoelectronic semiconductor chip has a semiconductor body and a substrate on which the semiconductor body is disposed. The semiconductor body has an active region disposed between a first semiconductor layer of a first conductor type and a second semiconductor layer of a second conductor type. The first semiconductor layer is disposed on the side of the active region facing the substrate. The first semiconductor layer is electrically conductively connected to a first termination layer that is disposed between the substrate and the semiconductor body. An encapsulation layer is disposed between the first termination layer and the substrate and, in plan view of the semiconductor chip, projects at least in some regions over a side face which delimits the semiconductor body.

8 Claims, 3 Drawing Sheets

(56) References Cited

U.S. PATENT DOCUMENTS

| | | | |
|---|---|---|---|
| 2008/0042145 A1 | 2/2008 | Hagleiter et al. | |
| 2010/0171135 A1 | 7/2010 | Engl et al. | |
| 2010/0208763 A1* | 8/2010 | Engl | H01L 33/405 372/46.01 |
| 2011/0049555 A1* | 3/2011 | Engl | H01L 33/382 257/98 |
| 2011/0220942 A1* | 9/2011 | Choi | H01L 33/38 257/98 |
| 2012/0012889 A1* | 1/2012 | Okabe et al. | 257/99 |

FOREIGN PATENT DOCUMENTS

| | | |
|---|---|---|
| DE | 102007022947 A1 | 10/2008 |
| DE | 102008022942 A1 | 11/2009 |
| DE | 102009033686 A1 | 1/2011 |
| JP | 2010263016 A | 11/2010 |
| KR | 20110006650 A | 1/2011 |
| TW | 200903863 A | 1/2009 |
| TW | 200950161 A | 12/2009 |
| TW | 201004000 A | 1/2010 |
| TW | 201044638 A1 | 12/2010 |
| WO | 2010125931 A1 | 11/2010 |

* cited by examiner

OPTOELECTRONIC SEMICONDUCTOR CHIP AND METHOD FOR PRODUCING OPTOELECTRONIC SEMICONDUCTOR CHIPS

This patent application is a national phase filing under section 371 of PCT/EP2012/052053, filed Feb. 7, 2012, which claims the priority of German patent application 10 2011 011 140.9, filed Feb. 14, 2011, each of which is incorporated herein by reference in its entirety.

TECHNICAL FIELD

The present application relates to an optoelectronic semiconductor chip and to a method for producing a plurality of optoelectronic semiconductor chips.

BACKGROUND

Luminescence diode chips are known wherein a mirror layer is arranged between a semiconductor body having an active region provided for generating radiation and a carrier element, said mirror layer being provided for reflecting radiation generated in the active region and thus for increasing the radiation power emitted overall. However, it has been found that degradation can occur in such semiconductor chips, for example, on account of oxidation of the mirror layer or upon the action of moisture on the semiconductor chip.

SUMMARY OF THE INVENTION

Embodiments of the present invention specify a semiconductor chip which has an improved aging stability and a reduced sensitivity toward moisture. Further embodiments of the invention specify a method by which efficient optoelectronic semiconductor chips can be produced in a simple and reliable manner.

In accordance with an embodiment, an optoelectronic semiconductor chip comprises a semiconductor body and a carrier, on which the semiconductor body is arranged. The semiconductor body has an active region, preferably provided for generating or for receiving radiation. The active region is arranged between a first semiconductor layer of a first conduction type and a second semiconductor layer of a second conduction type, which differs from the first conduction type. The first semiconductor layer is arranged on that side of the active region which faces the carrier. The first semiconductor layer is electrically conductively connected to a first connection layer, which is arranged between the carrier and the semiconductor body and preferably directly adjoins the first semiconductor layer. An encapsulation layer is arranged between the first connection layer and the carrier. In a plan view of the semiconductor chip, the encapsulation layer projects at least in regions beyond a side face that delimits the semiconductor body.

By means of the encapsulation layer, the first connection layer, which is preferably embodied as a mirror layer for the radiation to be generated or to be received in the active region, is decoupled from the surroundings. It can prevent air or moisture from penetrating into the first connection layer. Furthermore, the encapsulation layer can suppress migration of material of the first connection layer, for example silver.

The encapsulation layer preferably covers those regions of a main face of the semiconductor body facing the carrier in which the main face is not covered by the first connection layer. Particularly preferably, said regions are completely covered by the encapsulation layer, wherein the encapsulation layer furthermore preferably directly adjoins the main face.

In a preferred configuration, the encapsulation layer runs fully circumferentially around the semiconductor body in plan view, that is to say along the entire circumference of the semiconductor body. The encapsulation layer furthermore preferably adjoins the first semiconductor layer fully circumferentially along the side face of the semiconductor body. By means of the configuration projecting beyond the semiconductor body, the encapsulation layer is embodied in such a way that the main face of the semiconductor body is completely covered by the encapsulation layer even in the case of slight alignment deviations during production along the side faces of the semiconductor body.

In other words, the semiconductor body, in a plan view of the semiconductor chip, is preferably arranged completely within an outer boundary of the encapsulation layer.

In a further preferred configuration, a main extension plane of a region of the encapsulation layer that projects beyond the side face of the semiconductor body runs parallel to a main extension plane of the active region. In other words, the encapsulation layer continues beyond the side face of the semiconductor body in a planar fashion or in a substantially planar fashion. The side face of the semiconductor body is therefore free of material of the encapsulation layer.

In a further preferred configuration, an outer boundary of the first connection layer, in a plan view of the semiconductor chip, runs completely within the semiconductor body. Therefore, the first connection layer does not project beyond the semiconductor body at any location. Protection of the first connection layer against external environmental influences can thus be realized in a simplified manner.

In a further preferred configuration, the encapsulation layer is embodied in a metallic fashion. The encapsulation layer is furthermore preferably embodied in a multilayered fashion. Particularly preferably, the encapsulation layer comprises a gold layer.

The first connection layer preferably contains silver or consists of silver. Silver is distinguished by a particularly high reflectivity in the visible spectral range. Alternatively or supplementarily, the first connection layer can contain a different material having a high reflectivity, for example aluminum or palladium.

In a further preferred configuration, the encapsulation layer completely covers the first connection layer on the side facing away from the semiconductor body. The encapsulation layer furthermore preferably directly adjoins the first connection layer.

In one preferred configuration, the semiconductor body has at least one recess which extends from the carrier through the active region. The second semiconductor layer is preferably electrically conductively connected to a second connection layer in the recess.

The first connection layer is preferably arranged in regions between the semiconductor body and the second connection layer.

In order to avoid an electrical short circuit, a first insulation layer is preferably arranged between the first connection layer and the second connection layer, in particular, between the encapsulation layer and the second connection layer. The encapsulation layer is preferably embodied in such a way that the first insulation layer does not adjoin the first main face of the semiconductor body. In other words, the first insulation layer is spaced apart from the carrier at every location of the main face in a direction running perpendicularly toward the main face and toward the carrier.

In a method for producing a plurality of optoelectronic semiconductor chips, a semiconductor layer on a substrate is provided, wherein the semiconductor layer has an active region arranged between a first semiconductor layer of a first conduction type and a second semiconductor layer of a second conduction type, which differs from the first conduction type. A first connection layer is formed on the semiconductor layer sequence. An encapsulation layer is formed on the first connection layer. A composite assembly comprising the semiconductor layer sequence and a carrier is formed. A plurality of semiconductor bodies are formed from the semiconductor layer sequence, wherein the encapsulation layer is exposed in regions. The composite assembly is singulated into a plurality of semiconductor chips.

The method steps are preferably carried out in the order of the above enumeration. However, at least with regard to individual steps, other sequences can also be expedient.

The semiconductor bodies are preferably formed in such a way that the side faces arising in the course of forming the semiconductor bodies, in a plan view of the semiconductor layer sequence, lie completely within an outer boundary of the encapsulation.

In a preferred configuration, a growth substrate for the semiconductor layer sequence is removed. This is preferably done after the composite assembly has been formed. The carrier serves in particular for mechanically stabilizing the semiconductor layer sequence, such that the growth substrate is no longer required for this purpose.

The method described is particularly suitable for producing a semiconductor chip described further above. Therefore, features explained in connection with the semiconductor chip can also be used for the method, and vice versa.

BRIEF DESCRIPTION OF THE DRAWINGS

Further features, configurations and expediences will become apparent from the following description of the exemplary embodiments in conjunction with the figures.

Elements that are identical, of identical type or act identically are provided with the same reference signs in the figures.

The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF ILLUSTRATIVE EMBODIMENTS

Figure 1A:
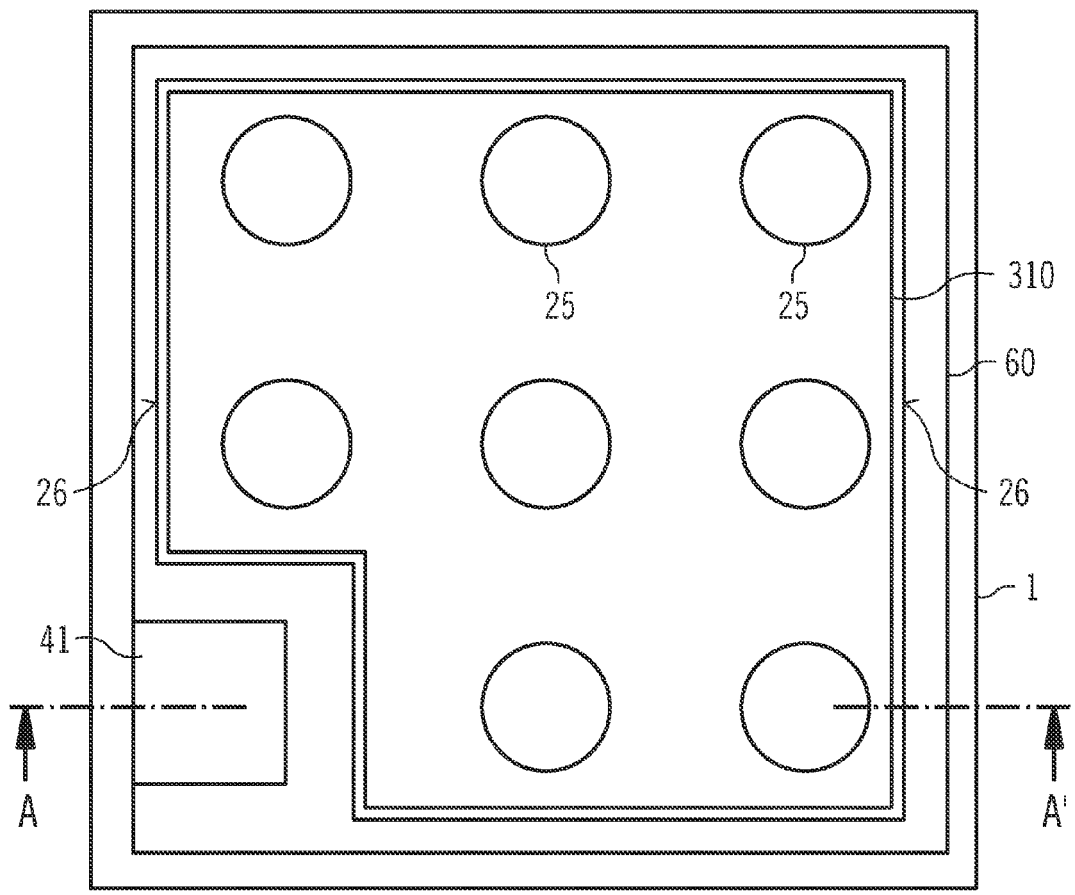
FIGS. 1A and 1B show an exemplary embodiment of a semiconductor chip in schematic plan view (FIG. 1A) and associated sectional view (FIG. 1B) along the line AA'.
Figure 1B:
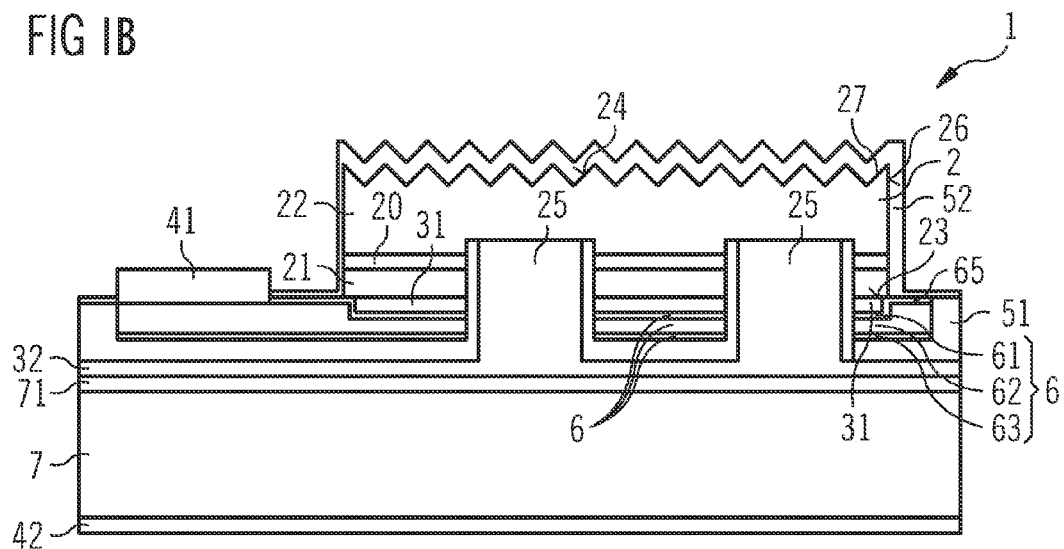

FIGS. 1A and 1B show an exemplary embodiment of a semiconductor chip 1, which is embodied by way of example as a luminescence diode semiconductor chip, in particular as a light emitting diode semiconductor chip. The semiconductor chip 1 comprises a semiconductor body 2 having an active region 20 provided for generating radiation. The active region 20 is arranged between a p-conducting semiconductor layer 21 and an n-conducting semiconductor layer 22. However, the semiconductor layers 21 and 22 can also be configured in an inverted manner with regard to their conduction type.

The semiconductor body 2, in particular the active region 20, is preferably based on nitride compound semiconductor material and is furthermore preferably provided for generating radiation in the visible or ultraviolet spectral range. In the present context, "based on nitride compound semiconductors" means that the active epitaxial layer sequence or at least one layer thereof comprises a nitride III/V compound semiconductor material, preferably $Al_nGa_mIn_{1-n-m}N$, wherein $0 \le n \le 1$, $0 \le m \le 1$ and $n+m \le 1$. In this case, this material need not necessarily have a mathematically exact composition according to the above formula. Rather, it can comprise one or more dopants and additional constituents which substantially do not change the characteristic physical properties of the $Al_nGa_mIn_{1-n-m}N$ material. For the sake of simplicity, however, the above formula includes only the essential constituents of the crystal lattice (Al, Ga, In, N), even if these can be replaced in part by small amounts of further substances. In a departure therefrom, other semiconductor materials, in particular III/V compound semiconductor materials, can also be used.

The semiconductor body 2 is fixed to a carrier 7 by means of a connecting layer 71, for example, a solder layer or an electrically conductive adhesive layer. The first semiconductor layer 21 forms a main face 23 of the semiconductor body facing the carrier. In a vertical direction, that is to say a direction running perpendicularly to a main extension plane of the semiconductor layers of the semiconductor body 2, the semiconductor body extends between the main face 23 and a radiation exit face 24. In order to increase the coupling-out efficiency of the radiation generated in the active region 20 during operation, the radiation exit face 24 is provided with a structuring 27. The structuring can be regular or irregular. By way of example, the structuring can be formed by means of pyramidal or truncated-pyramid-shaped depressions or a roughening.

In a lateral direction, that is to say along the main extension plane of the semiconductor layers of the semiconductor body, the semiconductor body 2 is delimited by a side face 26 running around the semiconductor body. In a plan view of the semiconductor chip 1, the side face 26 of the semiconductor body runs fully circumferentially completely within an outer boundary 60 of the encapsulation 6.

A first connection layer 31 adjoins the main face 23, said first connection layer preferably being embodied as a mirror layer for the radiation generated in the active region 20. The first connection layer preferably contains silver, palladium or aluminum or consists of such a material or of a metallic alloy comprising at least one of the materials mentioned. The materials mentioned have a high reflectivity in the visible spectral range.

An outer boundary 310 of the first connection layer 31, in a plan view of the semiconductor chip, runs completely within the side face 26 of the semiconductor body 2, such that the first connection layer 31 covers the main face 23 only in regions.

An encapsulation layer 6 adjoins on that side of the first connection layer 31 which faces away from the semiconductor body 2, said encapsulation layer being formed by means of a first layer 61, a second layer 62 and a third layer 63 in the exemplary embodiment shown.

In those regions of the main face 23 which are not covered by the first connection layer 31, the encapsulation layer 6 directly adjoins the first semiconductor layer 21. Furthermore, the encapsulation layer 6 projects beyond the side face 26 of the semiconductor body in a lateral direction and runs around the side face along the entire circumference in a plan view of the semiconductor chip. The encapsulation layer 6 is preferably dimensioned in a lateral direction such that the main face 23 is completely covered by the encapsulation layer even in the case of a slight alignment deviation in the course of forming the semiconductor body 2 along the side face. Preferably, the encapsulation layer, in a plan view of the semiconductor chip 1, projects beyond the side face by at least 1 μm at least in regions.

A region 65 of the encapsulation 6 that extends beyond the side face 26 in a plan view of the semiconductor chip 1 continues in a planar fashion in a lateral direction. The side faces 26 are therefore free of material for the encapsulation 6.

The first layer 61 preferably contains platinum, titanium, palladium, rhodium or tungsten or consists of such a material or an alloy comprising at least one of the materials mentioned. In particular, the first layer can contain titanium-tungsten nitride or platinum-titanium-tungsten nitride or consists of such a material.

The second layer 62 is preferably embodied as a gold layer. The second layer 62 expediently has a thickness such that, as a current spreading layer, it brings about an injection of charge carriers that is uniform in a lateral direction into the first semiconductor layer 21 via the first connection layer 31.

The third layer 63 is preferably embodied as an adhesion promoting layer with respect to the material that follows on the carrier side. By way of example, a TCO material (transparent conductive oxide) or a metal, for example titanium or chromium, is suitable for the third layer.

On the part of the main face 23, recesses 25 are formed in the semiconductor body 2, said recesses extending through the first semiconductor layer 21 and the active region 20 into the second semiconductor layer 22.

The second semiconductor layer 22 is electrically contact-connected via a second connection layer 32, which directly adjoins the second semiconductor layer 22 in the recesses 25. A first insulation layer 51 is arranged between the first connection layer 31 and the second connection layer 32. Said insulation layer is provided for preventing a direct electrical connection between the connection layers 31, 32 and a direct electrical connection of the second connection layer 32 to the first semiconductor layer 21.

The encapsulation 6 is used to prevent the insulation layer 51 from directly adjoining the main face 23. It has been found that, in the case of an insulation layer directly adjoining the first semiconductor layer 21, material of the encapsulation layer, for example gold, can migrate through the insulation layer and said material, in the first semiconductor layer 21, can lead to a catalytically amplified degradation of gallium nitride to gallium oxide if moisture passes through the first insulation layer to the main face 23. In particular, by virtue of the fact that the encapsulation completely covers those regions of the main face 23 which are not covered by the first connection layer 31, and directly adjoins the main face 23 in said regions, this risk of degradation is avoided. The sensitivity of the semiconductor chip 1 toward moisture and the aging stability of the semiconductor chip can thus be increased.

Furthermore, the semiconductor chip comprises a second insulation layer 52, which covers at least the side faces 26 of the semiconductor body 2 and preferably also the radiation exit face 24.

In particular an oxide, for example silicon oxide, a nitride, for example silicon nitride, or an oxynitride, for example silicon oxynitride, is suitable for the insulation layers 51, 52.

For external electrical contact-connection, the semiconductor chip 1 comprises a first contact 41 and a second contact 42, which are electrically conductively connected to the first connection layer 31 and, respectively, via the carrier 7 and the connecting layer 71, to the second connection layer 32, such that, during the operation of the semiconductor chip, charge carriers can be injected into the active region 20 from different sides thereof and can recombine there with emission of radiation.

In the exemplary embodiment described, the carrier 7 is formed from an electrically conductive material, for example a doped semiconductor material, for instance silicon or germanium. In a departure therefrom, the carrier can also be formed from an electrically insulating material, in which electrically conductive plated-through holes are formed for the purpose of electrical contact-connection. By way of example, a ceramic, for instance aluminum nitride or boron nitride, is suitable as electrically insulating material.

In order to protect the semiconductor chip against damage as a result of electrostatic discharge (ESD), a protective diode (not explicitly illustrated) can be integrated into the semiconductor chip, in particular into the semiconductor body or into the carrier.

In order to generate radiation that appears white to the human eye, a radiation conversion element can be disposed downstream of the semiconductor chip 1, said radiation conversion element converting the primary radiation generated in the active region partly or completely into secondary radiation. The radiation conversion element can be embodied, for example, as a plate fixed to the radiation exit face 24 (not explicitly illustrated).

In a departure from the exemplary embodiment described, the semiconductor chip 1 can also be embodied as a laser diode or as a radiation receiver.

Figure 2A:
FIGS. 2A to 2F show an exemplary embodiment of a method for producing a plurality of optoelectronic semiconductor chips.

An exemplary embodiment of a method for producing a plurality of semiconductor chips is shown on the basis of the intermediate steps illustrated schematically in FIGS. 2A to 2F. As illustrated in FIG. 2A, a semiconductor layer sequence 200 having an active region 20 provided for generating radiation is provided on a substrate 28, wherein the active region is arranged between a first semiconductor layer 21, which is formed on that side of the active region which faces the substrate, and a second semiconductor layer 22. The substrate can be, for example, the growth substrate for the epitaxial deposition of the semiconductor layer sequence 200, for instance, by means of MBE or MOVPE. By way of example, sapphire or silicon is suitable for the substrate.

For simplified illustration, only a part of the semiconductor layer sequence 200 is shown from which exactly one optoelectronic semiconductor chip emerges during the production of the semiconductor chips.

Figure 2B:
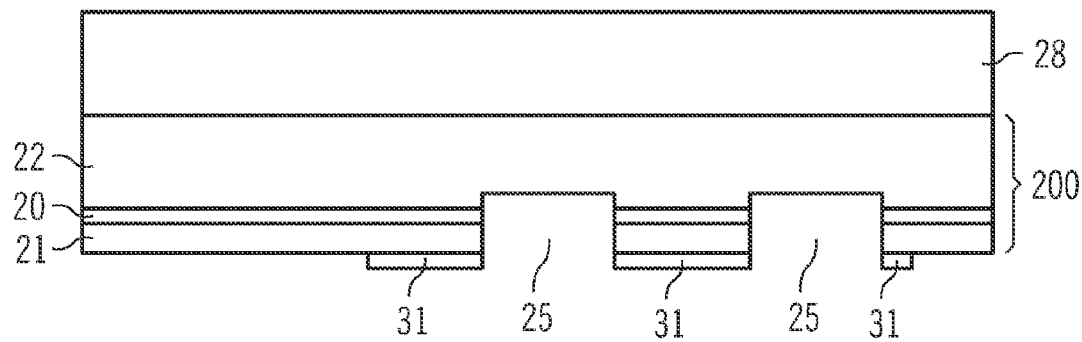

As illustrated in FIG. 2B, after the semiconductor layer sequence 200 has been formed, a plurality of recesses 25 are formed from the side facing away from the substrate 28, said recesses extending through the first semiconductor layer 21 and the active region 20 into the second semiconductor layer 22.

A first connection layer 31 is formed in regions on the first semiconductor layer 21, for example by means of vapor deposition or sputtering.

Figure 2C:
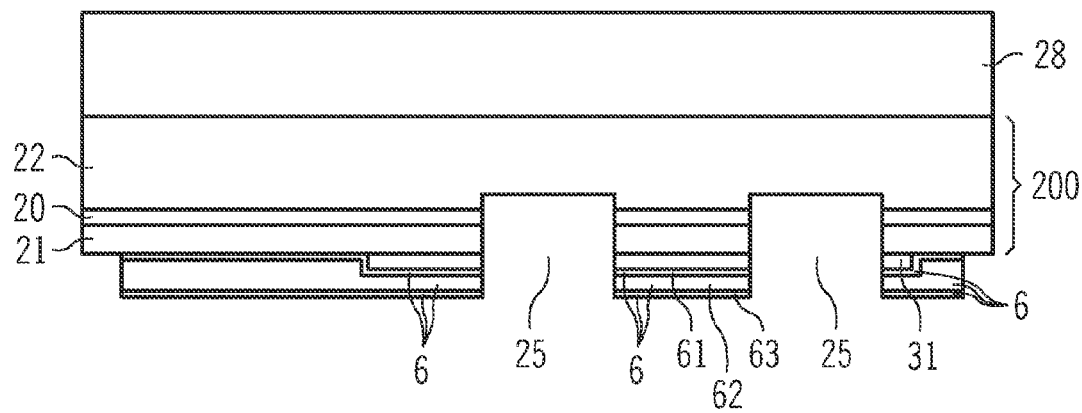

As illustrated in FIG. 2C, the first connection layer 31 is coated by means of a multilayered encapsulation 6. The layers of the encapsulation can be applied by means of sputtering or vapor deposition.

Figure 2D:
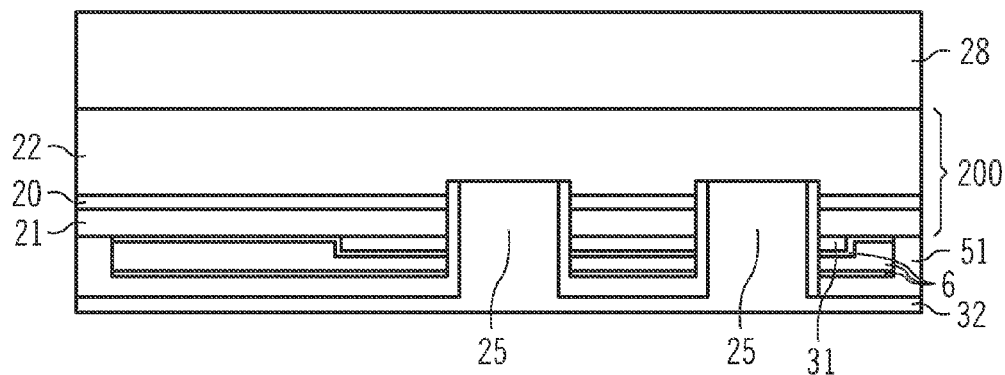

A first insulation layer 51 is applied on the encapsulation 6, for example by means of sputtering or vapor deposition. The first insulation layer covers the encapsulation 6 and also the first semiconductor layer 21 and the active region 20 in the region of the recesses 25. A second connection layer 32 is formed on the first insulation layer 51, said second connection layer forming an electrical contact with the second semiconductor layer 22 in the region of the recesses 25 (FIG. 2D).

Figure 2E:
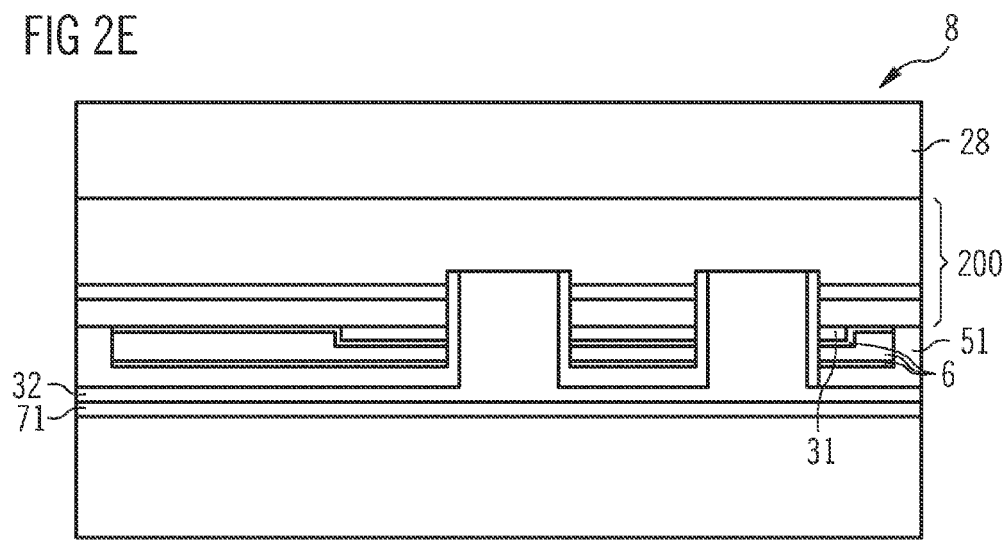
Figure 2F:
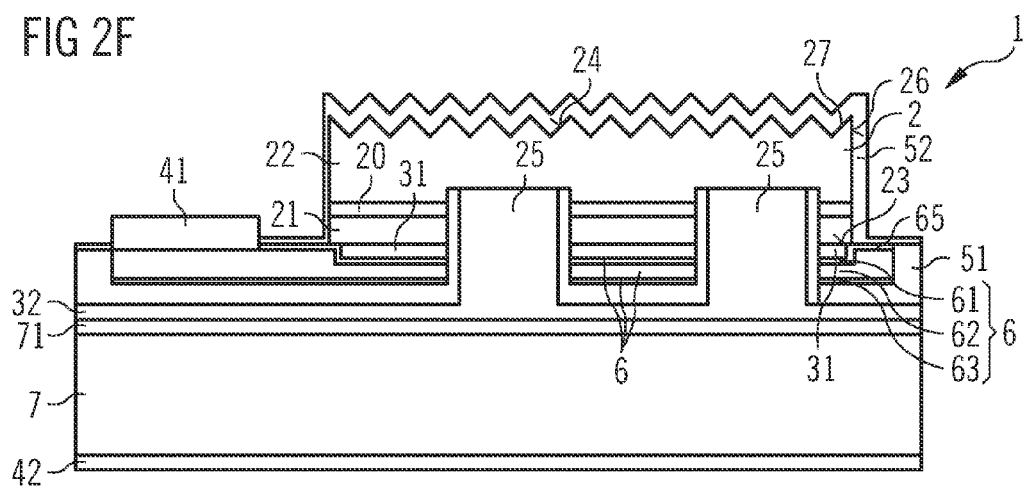

As illustrated in FIG. 2E, a composite assembly 8 is produced, comprising the substrate 28 with the layers arranged thereon and also a carrier 7. Fixing to the carrier is effected by means of a connecting layer 71, for instance a solder or an electrically conductive adhesive.

After mechanically stable connection to the carrier 7, the substrate 28 can be removed. This can be effected, for example, by means of coherent radiation, for instance by means of a laser lift-off method. In a departure therefrom, the removal can also be effected mechanically, for instance by means of grinding, lapping or polishing, and/or chemically, for instance by means of wet-chemical or dry-chemical etching.

After the removal of the substrate 28, semiconductor bodies 2 are formed from the semiconductor layer sequence 200. In the course of forming the semiconductor bodies, the encapsulation 6 is exposed in regions.

The semiconductor bodies can be formed in particular chemically, for instance by means of wet-chemical or dry-chemical etching.

In order to increase the coupling-out efficiency, the radiation exit face 24 facing away from the carrier 7 is structured, for instance by means of wet-chemical etching in order to form pyramidal depressions or by mechanical roughening.

For external electrical contact-connection, a first contact 41 and a second contact 42 are formed, for example by means of vapor deposition or sputtering.

After the side face 26 has been formed, a second insulation layer 52 is formed on the semiconductor body 2 and covers the side face, in particular the active region 20.

For the production of the semiconductor chips, the composite assembly 8 is singulated. This can be done, for example, by means of coherent radiation, for instance in a laser separating method, or mechanically, for instance by means of sawing, cleaving or breaking, or chemically, for instance by means of wet-chemical or dry-chemical etching. A completed semiconductor chip, embodied by way of example as described in connection with FIGS. 1A and 1B, is illustrated schematically in FIG. 2F.

The method described can be used to produce, in a simple and reliable manner, a semiconductor chip wherein the first connection layer 31 forms an aging-stable, highly reflective mirror layer for radiation generated in the active region 20. By means of the encapsulation 6 extending beyond the side face 26 of the semiconductor body 2 in a lateral direction, it is ensured that the insulation layers 51, 52, in the region of the main face 23, do not adjoin the first semiconductor layer 21 in direct proximity to the encapsulation 6. The risk of degradation of the semiconductor material, for instance on account of a catalytically amplified conversion of gallium nitride to gallium oxide, is thus avoided even during operation under moist conditions.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. An optoelectronic semiconductor chip comprising:
   a semiconductor body;
   a carrier, on which the semiconductor body is arranged; and
   an encapsulation layer;
   wherein the semiconductor body has an active region arranged between a first semiconductor layer of a first conduction type and a second semiconductor layer of a second conduction type that differs from the first conduction type;
   wherein the first semiconductor layer is arranged on a side of the active region that faces the carrier;
   wherein the first semiconductor layer is electrically conductively connected to a first connection layer, which is arranged between the carrier and the semiconductor body;
   wherein the encapsulation layer is arranged between the first connection layer and the carrier;
   wherein the encapsulation layer, in a plan view of the semiconductor chip, projects at least in regions beyond a side face that delimits the semiconductor body;
   wherein the semiconductor body, in a plan view of the semiconductor chip, is arranged completely within an outer boundary of the encapsulation layer;
   wherein an outer boundary of the first connection layer, in a plan view of the semiconductor chip, runs completely within the semiconductor body;
   wherein the encapsulation layer is metallic and in regions directly adjoins the first semiconductor layer; and
   wherein the semiconductor body has a recess which extends from the carrier through the active region, the second semiconductor layer being electrically conductively connected to a second connection layer in the recess.

2. The semiconductor chip according to claim 1, wherein the encapsulation layer runs fully circumferentially around the semiconductor body.

3. The semiconductor chip according to claim 1, wherein the encapsulation layer adjoins the first semiconductor layer fully circumferentially along the side face of the semiconductor body.

4. The semiconductor chip according to claim 1, wherein a main extension plane of a region of the encapsulation layer that projects beyond the side face of the semiconductor body runs parallel to a main extension plane of the active region.

5. The semiconductor chip according to claim 1, wherein the first connection layer contains silver, palladium or aluminum and the encapsulation layer comprises a gold layer.

6. The semiconductor chip according to claim 1, wherein the encapsulation layer completely covers the first connection layer on the side facing away from the semiconductor body.

7. The semiconductor chip according to claim 1, wherein the first connection layer is arranged in regions between the semiconductor body and the second connection layer.

8. The semiconductor chip according to claim 1, wherein the encapsulation layer directly adjoins the first connection layer and completely covers those regions of a main face of the semiconductor body facing the carrier in which the main face is not covered by the first connection layer, and directly adjoins the main face.

* * * * *